(12) United States Patent
Kapur et al.

(10) Patent No.: US 10,924,193 B2
(45) Date of Patent: Feb. 16, 2021

(54) TRANSMIT AND RECEIVE RADIO FREQUENCY (RF) SIGNALS WITHOUT THE USE OF BASEBAND GENERATORS AND LOCAL OSCILLATORS FOR UP CONVERSION AND DOWN CONVERSION

(71) Applicant: International Business Machines Corporation, Armonk, NY (US)

(72) Inventors: Mohit Kapur, Tarrytown, NY (US); Muir Kumph, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/721,106

(22) Filed: Sep. 29, 2017

(65) Prior Publication Data

US 2019/0103927 A1 Apr. 4, 2019

(51) Int. Cl.
*H04B 1/04* (2006.01)
*H04B 10/25* (2013.01)
(Continued)

(52) U.S. Cl.
CPC ............ *H04B 17/20* (2015.01); *H04B 1/04* (2013.01); *H04B 1/26* (2013.01); *H04B 10/2504* (2013.01);
(Continued)

(58) Field of Classification Search
USPC ....... 375/219, 220, 222, 221, 224, 225, 227, 375/228, 229–236, 240, 240.26, 240.29,
(Continued)

(56) References Cited

U.S. PATENT DOCUMENTS 5,714,954 A 2/1998 Chung et al.
5,839,099 A * 11/1998 Munsell ................ G10L 15/065
704/207
(Continued)

FOREIGN PATENT DOCUMENTS

CN 104316737 B 1/2015
EP 1873612 1/2008
(Continued)

OTHER PUBLICATIONS

Stephanie Overhoff, "Direct-Sampling DACs in Theory and Application", https://www.maximintegrated.com/en/app-notes/index.mvp/id/5446, Jun. 20, 2013, 5 pages.
(Continued)

*Primary Examiner* — Linda Wong (57) ABSTRACT

Embodiments include techniques for transmitting and receiving radio frequency (RF) signals, where the techniques for generating, via a digital analog converter (DAC), a frequency signal, and filtering the frequency signal to produce a first filtered signal and a second filtered signal. The techniques also include transmitting the second filtered signal to a device under test, and filtering the second filtered signal into a sub-signal having one or more components. The techniques include mixing the first filtered signal with the sub-signal to produce a first mixed signal, subsequently mixing the first mixed signal with an output signal received from the device under test to produce a second mixed signal, and converting the second mixed signal for analysis.

25 Claims, 5 Drawing Sheets

(51) Int. Cl.
*H04B 10/69* (2013.01)
*H04B 15/00* (2006.01)
*H04B 10/2507* (2013.01)
*H04B 17/20* (2015.01)
*H04B 1/26* (2006.01)

(52) U.S. Cl.
CPC ..... *H04B 10/25073* (2013.01); *H04B 10/697* (2013.01); *H04B 10/6971* (2013.01); *H04B 15/00* (2013.01)

(58) Field of Classification Search
USPC ....... 375/278, 284, 285, 316, 350, 346, 354, 375/356
See application file for complete search history.

(56) References Cited

U.S. PATENT DOCUMENTS

| | | | |
|---|---|---|---|
| 6,405,147 B1 | 6/2002 | Fera | |
| 6,489,911 B1 | 12/2002 | O'Dwyer | |
| 7,079,058 B2 | 7/2006 | Efland et al. | |
| 7,822,130 B2 | 10/2010 | Walvis | |
| 7,960,995 B2* | 6/2011 | Asami | G01R 31/31924 324/762.01 |
| 8,045,670 B2 | 10/2011 | Waheed | |
| 8,548,016 B2* | 10/2013 | Wagner | G01J 3/10 372/20 |
| 8,792,581 B2* | 7/2014 | Mu | H03F 1/3247 375/296 |
| 9,054,762 B2* | 6/2015 | Mirzaei | H04B 1/0483 |
| 9,385,798 B1 | 7/2016 | Marr et al. | |
| 9,520,831 B1 | 12/2016 | Foster et al. | |
| 2004/0246047 A1* | 12/2004 | Manku | H03D 7/1441 329/315 |
| 2004/0264547 A1* | 12/2004 | Robinson | G06F 1/0321 375/132 |
| 2005/0248374 A1 | 11/2005 | Kushnick | |
| 2008/0005213 A1 | 1/2008 | Holtzman | |
| 2010/0066994 A1* | 3/2010 | Petrov | G01S 17/36 356/5.1 |
| 2011/0032632 A1* | 2/2011 | Erden | G11B 20/10009 360/51 |
| 2011/0051790 A1 | 3/2011 | Honda | |
| 2011/0076131 A1* | 3/2011 | Stabley | F04D 27/001 415/1 |
| 2011/0199127 A1 | 8/2011 | Turner | |
| 2011/0300885 A1* | 12/2011 | Darabi | H04B 1/005 455/500 |
| 2012/0041720 A1* | 2/2012 | Pupalaikis | G01R 13/0272 702/189 |
| 2012/0183110 A1* | 7/2012 | Kolze | H04B 1/10 375/350 |
| 2012/0264377 A1 | 10/2012 | Seekebfreund et al. | |
| 2013/0021193 A1* | 1/2013 | Hermsen | G01S 5/0273 342/51 |
| 2013/0300460 A1 | 11/2013 | Gabbay | |
| 2014/0028482 A1* | 1/2014 | Pupalaikis | G01R 13/0272 341/118 |
| 2014/0240004 A1 | 8/2014 | Fawley et al. | |
| 2015/0180416 A1 | 1/2015 | Fernandez | |
| 2015/0097571 A1* | 4/2015 | Wei | G01R 31/088 324/531 |
| 2015/0358049 A1* | 12/2015 | Bonicatto | H04B 3/54 375/260 |
| 2016/0014341 A1* | 1/2016 | Miyahara | H04N 5/23258 348/208.11 |
| 2016/0050010 A1 | 2/2016 | Buehler et al. | |
| 2016/0087783 A1 | 3/2016 | Lin et al. | |
| 2016/0233877 A1* | 8/2016 | Pupalaikis | G01R 13/0272 |
| 2017/0038263 A1* | 2/2017 | Fury | G01K 7/16 |
| 2017/0250700 A1* | 8/2017 | Pupalaikis | G01R 13/0272 |

FOREIGN PATENT DOCUMENTS

| | | |
|---|---|---|
| EP | 2701032 | 2/2014 |
| WO | 2006125193 A2 | 11/2006 |
| WO | 2013165293 A1 | 11/2013 |
| WO | 2019063110 A1 | 4/2019 |

OTHER PUBLICATIONS

International Search Report and Written Opinion, International Application No. PCT/EF2017/080313; International Filing Date: Nov. 24, 2017, dated Aug. 10, 2018; 12 pages.

"AWG-Arbitrary Waveform Generator Basics", RF Wireless World, 2012, http://www.rfwireless-world.com/Articles/AWG-Arbitrary-Waveform-Generator-basics-and-types.html, Accessed Nov. 13, 2017 (5 pp.).

International Application No. PCT/EP20171080559 International Search Report and Written Opinion dated Jul. 11, 2018, 16 pages.

* cited by examiner

TRANSMIT AND RECEIVE RADIO FREQUENCY (RF) SIGNALS WITHOUT THE USE OF BASEBAND GENERATORS AND LOCAL OSCILLATORS FOR UP CONVERSION AND DOWN CONVERSION

BACKGROUND

The present invention generally relates to radio frequency transmission, and more specifically, to transmitting and receiving radio frequency (RF) signals without the use of baseband generators and local oscillators for up conversion and down conversion of signals.

Radio frequency signals are used daily for communication in personal and commercial applications. Personal applications include cellular and mobile phones while commercial applications can include using WiFi networks and other wireless networks in an enterprise environment to exchange data. The RF frequency signals are generated in a baseband and shifted to a higher frequency for transmission. Heterodyning is the process of shifting signals from a first frequency range to a second frequency range. In order to perform heterodyning the RF transmitters and receivers include baseband generators and local oscillators to up convert these signals. In addition, when the RF signals are received they are down converted back to the baseband for further processing. Heterodyning requires the use of complex equipment to perform the process for RF communication.

SUMMARY

Embodiments of the present invention are directed to a computer-implemented method for transmitting and receiving radio frequency (RF) signals. A non-limiting example of the computer-implemented method includes generating, via a Field Programmable Gate Array (FPGA) digital signals which can be fed to a digital-to-analog converter (DAC), a frequency signal, and filtering the frequency signal to produce a first filtered signal and a second filtered signal. The method includes transmitting the second filtered signal to a device under test and filtering the second filtered signal into a sub-signal having one or more components. The method includes mixing the first filtered signal with the sub-signal to produce a first mixed signal, subsequent mixing the first mixed signal with an output signal received from the device-under-test (DUT) to produce a second mixed signal, and converting the second mixed signal for analysis.

Embodiments of the present invention are directed to a system for transmitting and receiving RF signals. A non-limiting example of the system includes a storage medium, the storage medium being coupled to a processor, where the processor configured to generate, via a digital-to-analog converter (DAC), a frequency signal, and filter the frequency signal to produce a first filtered signal and a second filtered signal. The processor is also configured to transmit the second filtered signal to a DUT, and filter the second filtered signal into a sub-signal having one or more components. The processor is configured to mix the first filtered signal with the sub-signal to produce a first mixed signal, mix the first mixed signal with an output signal received from the DUT to produce a second mixed signal, and convert the second mixed signal for analysis.

Embodiments of the invention are directed to a computer program product for transmitting and receiving RF signals, the computer program product comprising a computer-readable storage medium having program instructions embodied therewith. The program instructions are executable by a processor to cause the processor to perform a method. A non-limiting example of the method includes generating, via a Field Programmable Gate Array (FPGA) that feeds digital signals to a digital-analog converter (DAC), wherein the DAC generates a frequency signal, a frequency signal, and filtering the frequency signal to produce a first filtered signal and a second filtered signal. The method includes transmitting the second filtered signal to a DUT, and filtering the second filtered signal into a sub-signal having one or more components. The method includes mixing the first filtered signal with the sub-signal to produce a first mixed signal, subsequent mixing the first mixed signal with an output signal received from the DUT to produce a second mixed signal, and converting the second mixed signal for analysis.

Embodiments of the present invention are directed to a device for transmitting and receiving RF signals. A non-limiting example of the device includes a Field Programmable Gate Array (FPGA) that feeds digital signals to a digital-analog converter (DAC), wherein the DAC generates a frequency signal and one or more first filters to produce a first filtered signal and a second filtered signal. The device also includes an interface to transmit the second filtered signal to a DUT, and one or more second filters to filter the second filtered signal into a sub-signal having one or more components. The device includes a first mixer configured to mix the first filtered signal with the sub-signal to produce a first mixed signal, a second mixer to mix the first mixed signal with an output signal received from the DUT to produce a second mixed signal, and an analog-to-digital converter (ADC) to convert the second mixed signal for analysis.

Embodiments of the present invention are directed to a system for transmitting and receiving RF signals. A non-limiting example of the system includes a transmit path including a Field Programmable Gate Array (FPGA) that feeds digital signals to a digital-analog converter (DAC), wherein the DAC generates a frequency signal, one or more filters to produce a first filtered signal and a second filtered signal, an interface to transmit the second filtered signal to a DUT, one or more secondary filters to filter the second filtered signal into a sub-signal having one or more components, and a mixer configured to mix the first filtered signal with the sub-signal to produce a first mixed signal. The system also includes a receive path including one or more filters to filter an output signal received from the DUT, a second mixer to mix the first mixed signal with the signal received from the DUT to produce a second mixed signal, and an analog-to-digital converter (ADC) to convert the second mixed signal for analysis.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, conventional RF signal transmission, and reception is performed by generating signals of interest in the baseband (KHz to a few MHz). These signals are subsequently mixed (up conversion) with local oscillators which can operate in the range of MHZ or GHz. The RF signals that are received are mixed (down conversion) with (signals from) another local oscillator to obtain the signals back in the baseband for further processing. The process of converting the signals by mixing a combination of signals is known is heterodyning. The hardware needed to perform the up conversion and the down conversion of the system adds a cost.

The techniques described herein no longer require the use of the baseband generators and local oscillator for the up conversion or down conversion processes. A DAC is used to produce a signal that is ready to be directly transmitted in the RF spectrum. In addition, the DAC also produces a signal used to down convert the signal that is received to obtain the appropriate signal for processing. Therefore, the single DAC provides a high correlation between the transmitted signal and the received signal for determining whether a phase shift has occurred in the received signal.

The up conversion and the down conversion of the RF signals require multiple local oscillators. In addition, certain applications may require a strict phase lock between the local oscillators at the transmission and reception. Issues with the mixers can arise as they are not continuous signals. Any deviation within the phase of the signals can lead to unwanted results. The techniques described herein, eliminate the need for complex heterodyning equipment as a DAC is used to produce signals that do not need to be up converted prior to transmitting the RF signals.

Turning now to an overview of the aspects of the invention, one or more embodiments of the invention address the above-described shortcomings of the prior art by providing a technique that uses a digital-to-analog converter (DAC) to transmit an RF signal and perform a test of the DUT, where the received signal is down converted without using a local oscillator.

The above-described aspects of the invention address the shortcomings of the prior art by eliminating the need to ensure the phase of the local oscillator in a receive path and a local oscillator in a transmit path are synchronized.

Figure 1:
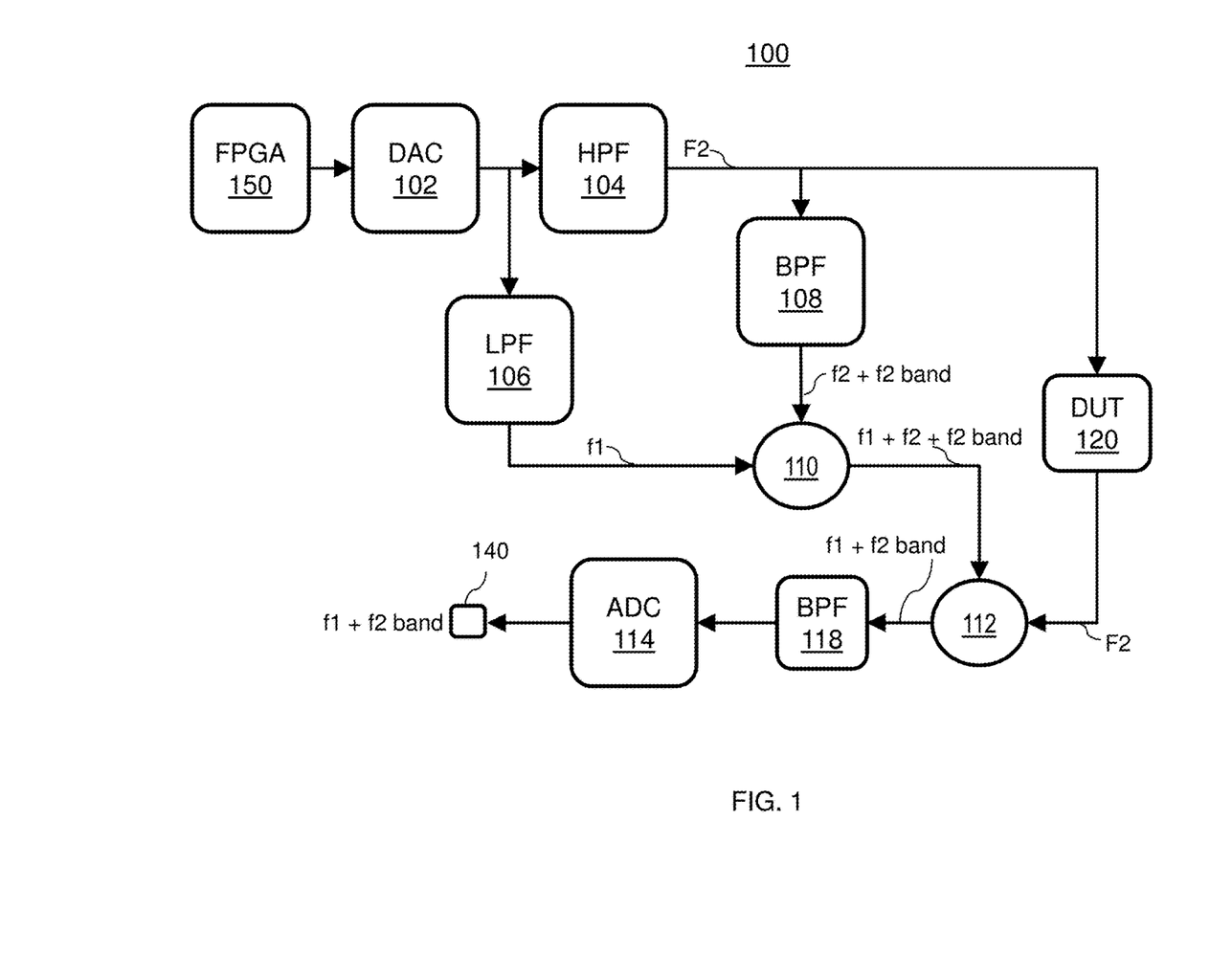
FIG. 1 depicts a block diagram of a system for transmitting and receiving radio frequency (RF) signals in accordance with one or more embodiments.

Referring to FIG. 1, a system 100 for transmitting and receiving RF signals is shown. One or more components of the system 100 can be implemented using the various electrical components. For example, one or more of the components in FIG. 1 can be implemented in a field-programmable gate array or other type of integrated circuits. In one or more embodiments, the digital-to-analog converter (DAC) 102 is used to convert an input digital code into an analog waveform, wherein the frequency of the analog waveform can be a composite waveform representing the sum of a plurality of waveforms. The DAC can be an electrical circuit component used to convert digital signals into analog signals. In one or more embodiments, FPGA 150 digital signals can be fed to a digital-analog converter DAC 102. In addition, the DAC 102 is coupled to a high pass filter 104 and a low pass filter 106 to extract the desired waveforms from the plurality of waveforms. The filters can be low pass, high pass, or bandpass filters. Theses filters can be configured with various circuit components such as resistors, inductors, and capacitors. It is understood that one of ordinary skill in the art can configure the filters using different elements.

The low pass filter 106 outputs a first filtered signal f1. The first filtered signal can be a signal that is in the MHz or KHz range. Non-limiting examples of the first filtered signal provided by the low pass filter 106 can be a 1 MHz, 5 MHz, or 10 MHz signal. It is to be understood that other frequency signals can be used. The first filtered signal is used to filter any direct current (DC) noise interference that may exist from the components of the system leaking current or voltage. In other embodiments, the system 100 can still function when the first filtered signal from the low pass filter 106 is 0 Hz.

The high pass filter 104 is used to transmit the desired data over the RF spectrum. The high pass filter 104 provides a second filtered signal F2 in the GHz range. Non-limiting examples of the second filtered signal includes a 1 GHz, 5 GHz, and 50 GHz signal. It is to be understood that other values in the GHz range can be included in the second filtered signal. The second filtered signal F2 from the high pass filter 104 can be transmitted directly to a DUT over the RF spectrum. Non-limiting examples of the DUTs include communications systems where data is encoded in phase, radars, test equipment for RF systems, semiconductors, cryogenic electronic devices, and the like. It is to be understood that other systems and equipment can be analyzed using the techniques described herein.

Because the DAC 102 is used to generate the signal, this signal will have images in the higher NyQuist regions of the spectrum. These higher NyQuist images fall in the RF region of multiple Giga-Hertz, therefore, a baseband generator and local oscillator is not needed to up convert the signal prior to transmission over the RF spectrum. The second filtered signal F2 from the high pass filter 104 is also filtered by a bandpass filter 108 to obtain a sub-signal having a center frequency component f2 and frequency band component "f2 band" which includes the center frequency component f2.

The output of the bandpass filter 108, including the sub-signal (f2+f2 band), is coupled to a first mixer 110 and provides the sub-signal (f2+f2 band) to the first mixer 110, where the output of the low pass filter 106 is mixed with the output of the bandpass filter 108. The output of the low pass filter 106 is sub-signal f1. The mixer is an electrical component that configured to mix a combination of input signals to arrive at an output signal. The combination of input signals can be added together, subtracted from one another, or both added and subtracted to each other by the mixer where the output of the mixer results in a signal. In an example, the frequency f1, f2, and the f2 band is added together at the first mixer 110 resulting in a first mixed signal (f1+f2+f2 band).

The output of the first mixer 110, including the f1, f2, f2 band, is coupled to a downstream mixer 112 and provides the first mixed signal (f1+f2+f2 band). The output of the DUT 120 is a processed version of the second filtered signal F2 which includes the sub-signal (f2+f2 band) in FIG. 1. The mixer 112 is configured to receive the output signal F2 from the DUT 120. The mixer 112 removes the f2 component of the received output signal F2 from the DUT 120 to determine whether a phase shift has occurred in the received output signal. The mixer 112 outputs a second mixed signal (f1+f2 band).

In one or more embodiments, the mixer 112 is coupled to a bandpass/low pass filter 118 for anti-aliasing of the signal and also to filter out any other unwanted signals where the filter 118 receives the second mixed signal (f1+f2 band) from the mixer 112. The output of the bandpass/low pass filter is provided to an analog-to-digital converter (ADC) 114 for further processing and/or analysis. The ADC is an electrical component that is used to convert analog signals into to digital signals. The output 140 provides the digitized version of the second mixed signal (f1+f2 band).

Figure 2:
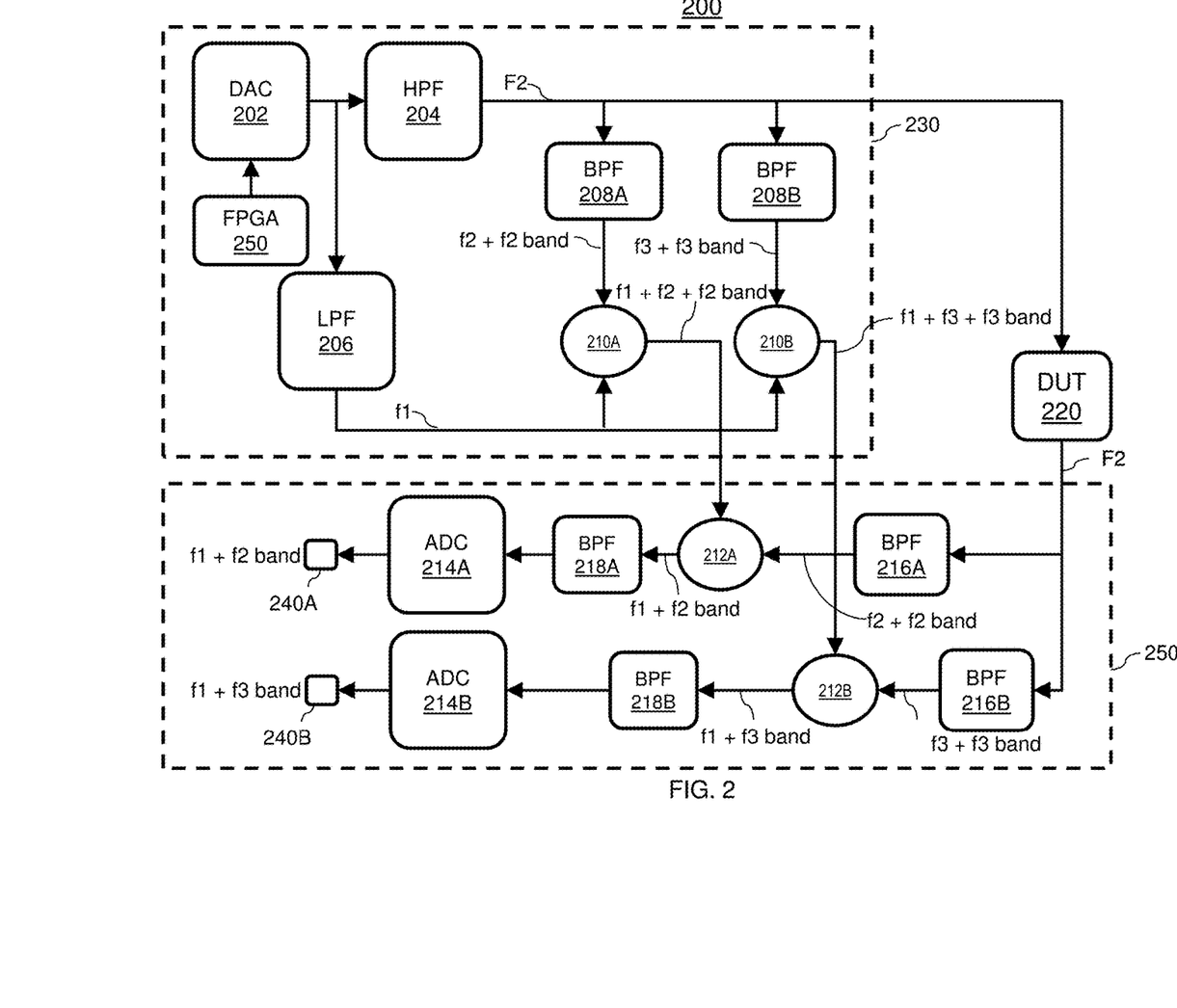
FIG. 2 depicts a block diagram of a system for transmitting and receiving radio frequency (RF) signals in accordance with one or more embodiments.

Now referring to FIG. 2, a system 200 for transmitting and receiving RF signals is provided. The system 200 includes a transmit path 230 including the FPGA 250, DAC 202, filters 204, 206, 208A, 208B and mixers 210A, 210B. The system 200 also include a receive path 230 including filters 216A, 216B, 218A, 218B, mixers 212A, 212B, and ADC 214A, 214B.

In one or more embodiments, the FPGA 250 digital signals can be fed to a digital-to-analog converter DAC 202 that is configured to generate a frequency signal such as a composite waveform. The DAC 202 is coupled to the high pass filter 204 and low pass filter 206. The low pass filter 206 is configured to output a first filtered signal f1 and the high pass filter 204 is configured to output a second filtered signal F2. The second filtered signal F2 is transmitted to a DUT 220, where the second filtered signal F2 includes the (f2+f2 band) signal and (f3+f3 band) signal. In other embodiments, because the second filtered signal F2 is a composite signal it can include signals f2, f3, f4 . . . , fn and their associated f2, f3, f4, . . . , fn bands, where n is an integer.

The output of the high pass filter 204 is coupled to bandpass filters 208A and 208B, where the output of the bandpass filters 208A and 208B are coupled to mixers 210A and 210B, respectively. The bandpass filters 208A and 208B are configured to obtain different frequency signals from the composite waveform of the second filtered signal F2. In this non-limiting example, the bandpass filter 208A outputs a sub-signal (f2+f2 band) and the bandpass filter 208B outputs a sub-signal (f3+f3 band). The mixers 210A and 210B add the output of the low pass filter 206, the first filtered signal f1 to each of the sub-signals output of the bandpass filters 208A and 208B. Although only two bandpass filters 208A and 208B are shown in FIG. 200, it is to be understood that any number of bandpass filters and mixers can be used. The output of the mixers 210A and 210B produce the first mixed signals (f1+f2+f2 band) and (f1+f3+f3 band) and are provided to the mixers 212A and 212B, respectively.

The output signal F2 from the DUT 220 which includes a processed version of the (f2+f2 band) and the (f3+f3 band), is provided to bandpass filter 216A and 216B, where the output of the bandpass filters 216A and 216B are provided to mixers 212A and 212B, respectively. The processed version of the signals may include a phase shift that has occurred at the DUT 220 which can be compared to the second filtered signal F2 input into the DUT 220. The mixers 212A and 212B remove the center frequency component (f2 and f3, respectively) from the received output signal F2 to produce the second mixed signals (f1+f2 band) and (f1+f3 band). The mixer 212A forwards the second mixed signal (f1+f2 band signal) to the ADC 214A and the mixer 212G forwards the second mixed signal (f1+f3 band) to the ADC 214B. The signals can be digitized and output (240A, 240B) from the ADC for further processing and/or analysis. This information can be used to determine whether a phase shift has occurred in the output signal F2 received from the DUT 220 when compared to the F2 signal that has been transmitted to the DUT 220 from the high pass filter 204. It is to be understood that the receive path 230 can include any number of filters 216, 218, mixers 212, and ADC 214 can be used to correspond to the elements in the transmit path 230.

Figure 3:
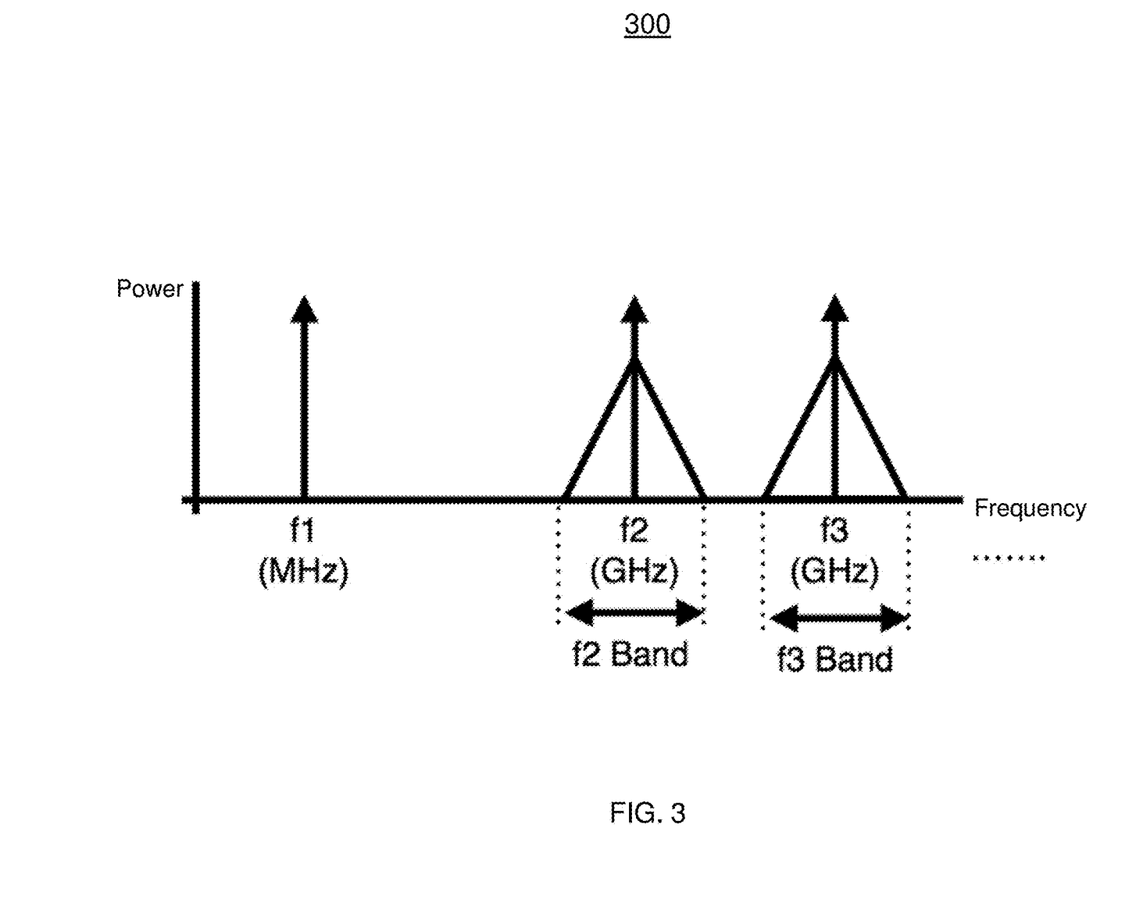
FIG. 3 depicts a spectrum for transmitting and receiving radio frequency (RF) signals in accordance with one or more embodiments.

Now referring to FIG. 3, a graph 300 showing the spectrum for transmitting and receiving RF signals in accordance with one or more embodiments is shown. The x-axis of the graph 300 represents the frequency and the y-axis represents the power. The f1 signal represents the low frequency signal provided from the low pass filter. The f2 and f3 signals are the center frequency components and the f2 band and f3 band are obtained from the signal produced by the DAC using bandpass filters. The combination of the center frequency component and the associated band is the sub-signal described in FIG. 1 and FIG. 2. The f2, f2 band and f3, f3 band represent the first NyQuist regions, where the first NyQuist regions is half of the sampling frequency of the DAC. This entire spectrum the repeats at a higher NyQuist. Although only the f1, f2, and f3 signals are shown in the graph it is to be understood that any number of frequencies fn can be provided.

Figure 4:
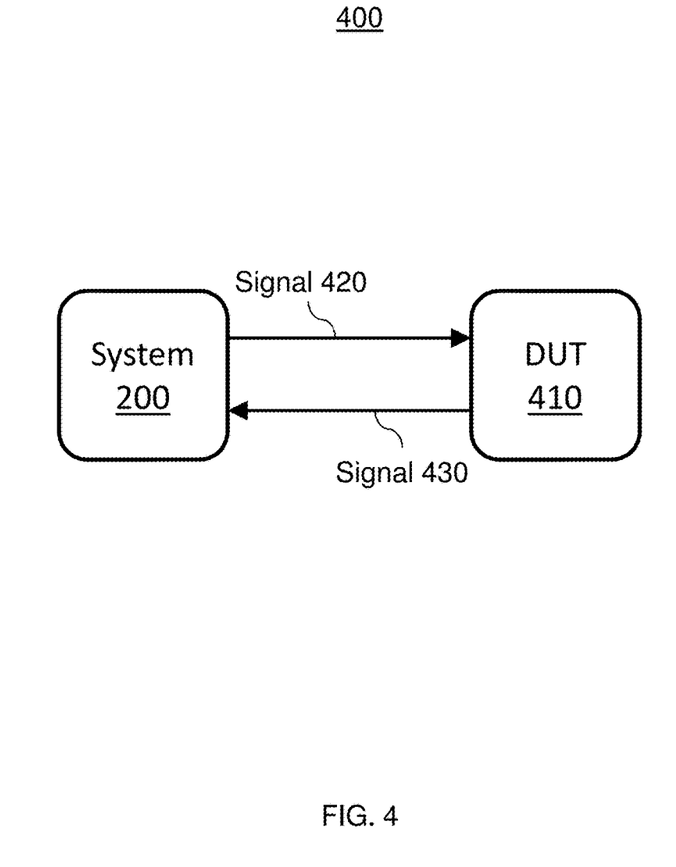
FIG. 4 depicts a block diagram of a system for transmitting and receiving radio frequency (RF) signals in accordance with one or more embodiments.

Now referring to FIG. 4, a system 400 for transmitting and receiving RF signals in accordance with one or more embodiments is shown. The system 400 includes the system 200 of FIG. 2 transmitting a signal 420 to a DUT 410. In an embodiment, the signal 420 is generated by the DAC so there is no up conversion of the signal that is required prior to transmission. The signal 420 can be a composite signal which is the sum of a plurality of waveforms. After the signal is processed by the DUT, a signal 430 is transmitted back to the system 200 and received for further processing to determine whether any phase shift has occurred between the transmitted signal 420 and the received signal 430.

Figure 5:
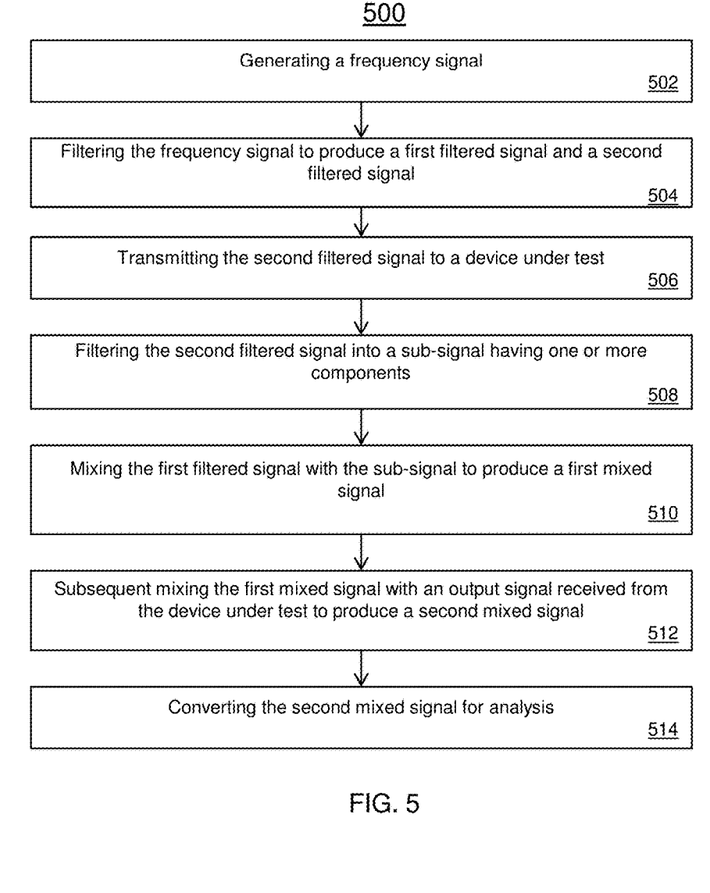
FIG. 5 depicts a flow diagram for transmitting and receiving radio frequency (RF) signals in accordance with one or more embodiments.

Now referring to FIG. 5, a method 500 for transmitting and receiving RF signals in accordance with one or more embodiments is shown. Block 502 provides generating, via a digital-analog converter (DAC), a frequency signal. In one or more embodiments, the generated frequency signal is a composite waveform which represents the sum or combination of one or more waveforms. The combination of waveforms can have various frequencies, amplitudes, and phases and can include various types of waveforms such as, but not limited to, sine waves, square waves, triangle waves, and sawtooth waves. The complex waveforms can include any combination of the aforementioned waveforms. The individual waveforms can be filtered to extract the desired frequency ranges for analysis and/or manipulation. For the purposes of DUT testing and operations, it is useful to generate such complex waveforms. The complex waveforms permit parameter extraction and subsequent higher performance operation in regimes that are unobtainable with conventional digital logic resulting in improved performance of the DUT.

Block 504 includes filtering the frequency signal to produce a first filtered signal and a second filtered signal. In one or more embodiments, the first filtered signal is filtered using a low pass filter and the second filtered signal is a high pass filter.

Block 506 includes transmitting the second filtered signal to a DUT. In an embodiment, the second filtered signal is a high pass signal that is directly transmitted to the RF spectrum. By using the DAC to produce the signals, there is no need to up convert the signal prior to transmission. There is also no need to include a local oscillator in the transmit path since the up conversion is not performed.

Block 508 includes filtering the second filtered signal into a sub-signal having one or more components. In an embodiment, one or more bandpass filters can be used to obtain a frequency band of interest from the signal that is output from the high pass filter. The one or more components include a frequency band component and the center frequency component for the associated frequency band. The bandpass filters are configured based at least in part on the desired frequencies to be tested by the DUT.

Block 510 includes mixing the first filtered signal with the sub-signal to produce a first mixed signal. In one or more embodiments, the output of the low pass filter is added to the output of the bandpass filter at a first mixer. In other embodiments, the output of the low pass filter can be combined with one or more sub-signals from a plurality of sub-signals to produce a plurality of first mixed signals.

Block 512 includes subsequently mixing the first mixed signal with a signal received from the DUT to produce a second mixed signal. In one or more embodiments, the output of the first mixer is provided to another downstream mixer, where the center frequency component is removed from the output signal received from the DUT at the downstream mixer. After the center frequency component is removed from the received signal a phase shift can be realized between the initially transmitted signal and the received signal, if such a phase shift exists. In one or more embodiments, the signal from the DUT can be filtered prior to the downstream mixer to remove the unwanted components. For example, the output signal from the DUT is a composite signal having the center frequencies and associated bands for multiple frequencies. The bandpass filter can be used to filter a single frequency band and center frequency of interest. Multiple bandpass filters can be used to extract the respective frequencies from the output signal of the DUT. In a different embodiment, the DUT can filter the signals before the signal is received by the system.

Block 514 includes converting the second mixed signal for analysis. In one or more embodiments, an analog-to-digital converter is used to digitize the output of the downstream mixer for analysis and/or further processing.

The techniques improve over the prior art by eliminating the need to use a baseband generator and local oscillator for the up conversion and down conversion of RF signals. In addition, phase comparison information is highly correlated, because the signals are originated by the same source.

The techniques described herein provide a method and system to transmit and receive RF signals without the use of baseband generators and local oscillators for up conversion and down conversion.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
generating, via a digital analog converter (DAC), a frequency signal;
filtering the frequency signal to produce a first filtered signal and a second filtered signal;
transmitting the second filtered signal to a device under test;
filtering the second filtered signal into a sub-signal having one or more components;
mixing the first filtered signal with the sub-signal to produce a first mixed signal;
subsequently mixing the first mixed signal with an output signal received from the device under test to produce a second mixed signal; and
converting the second mixed signal for analysis.

2. The computer-implemented method of claim 1, wherein the second filtered signal is filtered into a plurality of sub-signals, wherein one or more bandpass filters are used to obtain each of the plurality of sub-signals.

3. The computer-implemented method of claim 1, wherein the one or more components include a center frequency component and a frequency band component, wherein the frequency band component is associated with the center frequency component.

4. The computer-implemented method of claim 2, wherein each of the plurality of sub-signals is independently mixed with the first filtered signal to produce a plurality of first mixed sub-signals.

5. The computer-implemented method of claim 4, wherein the plurality of first mixed sub-signals are independently mixed with the output signal received from the device under test to produce a plurality of second mixed sub-signals.

6. The computer-implemented method of claim 1, wherein filtering the frequency signal includes a low pass filter to produce the first filtered signal, and a high pass filter to produce the second filtered signal.

7. The computer-implemented method of claim 2, wherein the mixing adds the first filtered signal to each of the plurality of sub-signals, wherein each of the plurality of sub-signals include one or more components, wherein the one or more components include a center frequency component and a frequency band component, and wherein the subsequent mixing subtracts the center frequency component from the output signal received from the device under test.

8. The computer-implemented method of claim 1, wherein the output signal received from the device under test is filtered by one or more bandpass filters prior to performing the subsequent mixing.

9. The computer-implemented method of claim 1, wherein the first filtered signal is in a Mega-Hertz frequency range and the second filtered signal is in a Giga-Hertz frequency range.

10. A system for transmitting and receiving radio frequency (RF) signals, the system comprising:
a storage medium, the storage medium being coupled to a processor;
the processor configured to:
generate, via a digital analog converter (DAC), a frequency signal;
filter the frequency signal to produce a first filtered signal and a second filtered signal;
transmit the second filtered signal to a device under test;
filter the second filtered signal into a sub-signal having one or more components;
mix the first filtered signal with the sub-signal to produce a first mixed signal;
subsequently mix the first mixed signal with an output signal received from the device under test to produce a second mixed signal; and
convert the second mixed signal for analysis.

11. The system of claim 10, wherein the second filtered signal is filtered into a plurality of sub-signals, wherein one or more bandpass filters are used to obtain each of the plurality of sub-signals.

12. The system of claim 10, wherein the one or more components include a center frequency component and a frequency band component, wherein the frequency band component is associated with the center frequency component.

13. The system of claim 11, wherein each of the plurality of sub-signals is independently mixed with the first filtered signal to produce a plurality of first mixed sub-signals.

14. The system of claim 13, wherein the plurality of first mixed sub-signals are independently mixed with the output signal received from the device under test to produce a plurality of second mixed sub-signals.

15. The system of claim 10, further comprises a low pass filter to produce the first filtered signal, and a high pass filter to produce the second filtered signal.

16. The system of claim 11, wherein the mixing adds the first filtered signal to each of the plurality of sub-signals, wherein each of the plurality of sub-signals include one or more components, wherein the one or more components include a center frequency component and a frequency band component, and wherein the subsequent mixing subtracts the center frequency component from the output signal received from the device under test.

17. The system of claim 10, wherein the frequency signal is a complex waveform that is provided to the device under test, wherein the device under test is at least one of a phase encoded communication system, RF test equipment, cryogenic electronic device, or semiconductor device.

18. A computer program product for transmitting and receiving radio frequency (RF) signals, the computer program product comprising:
a computer readable storage medium having stored thereon program instructions executable by a processor to cause the processor to:
generate, via Field Programmable Gate Array (FPGA) digital signals which can be fed to a digital analog converter (DAC), a frequency signal;
filter the frequency signal to produce a first filtered signal and a second filtered signal;
transmit the second filtered signal to a device under test;
filter the second filtered signal into a sub-signal having one or more components;
mix the first filtered signal with the sub-signal to produce a first mixed signal;
subsequently mix the first mixed signal with an output signal received from the device under test to produce a second mixed signal; and
convert the second mixed signal for analysis.

19. The computer program product of claim 18, wherein the second filtered signal is filtered into a plurality of sub-signals, wherein one or more bandpass filters are used to obtain each of the plurality of sub-signals.

20. The computer program product of claim 19, wherein each of the plurality of sub-signals is independently mixed with the first filtered signal to produce a plurality of first mixed sub-signals.

21. The computer program product of claim 20, wherein the plurality of first mixed sub-signals are independently mixed with the output signal received from the device under test to produce a plurality of second mixed sub-signals.

22. The computer program product of claim 19, wherein the mixing adds the first filtered signal to each of the plurality of sub-signals, wherein each of the plurality of sub-signals include one or more components, wherein the one or more components include a center frequency component and a frequency band component, and wherein the subsequent mixing subtracts the center frequency component from the output signal received from the device under test.

23. The computer program product of claim 18, wherein the signal received from the device under test is filtered by one or more bandpass filters prior to performing the subsequent mixing.

24. A device for transmitting and receiving RF signals, the device comprising:
   a Field Programmable Gate Array (FPGA) that feeds digital signals to a digital analog converter (DAC), wherein the DAC generates a frequency signal;
   one or more first filters to produce a first filtered signal and a second filtered signal;
   an interface to transmit the second filtered signal to a device under test;
   one or more second filters to filter the second filtered signal into a sub-signal having one or more components;
   a first mixer configured to mix the first filtered signal with the sub-signal to produce a first mixed signal;
   a second mixer to mix the first mixed signal with an output signal received from the device under test to produce a second mixed signal; and
   an analog-to-digital converter (ADC) to convert the second mixed signal for analysis.

25. A system for transmitting and receiving radio frequency (RF) signals, the system comprising:
   a transmit path comprising:
      a Field Programmable Gate Array (FPGA) that feeds digital signals to a digital analog converter (DAC), wherein the DAC generates a frequency signal;
      one or more filters to produce a first filtered signal and a second filtered signal;
      an interface to transmit the second filtered signal to a device under test;
      one or more secondary filters to filter the second filtered signal into a sub-signal having one or more components; and
      a mixer configured to mix the first filtered signal with the sub-signal to produce a first mixed signal;
   a receive path comprising:
      one or more filters to filter an output signal received from the device under test;
      a second mixer configured to mix the first mixed signal with an output signal of the one or more filters to filter the output signal received from the device under test to produce a second mixed signal; and
      an analog-to-digital converter (ADC) to convert the second mixed signal for analysis.

* * * * *